(12) United States Patent
Flint et al.

(10) Patent No.: US 8,294,522 B2
(45) Date of Patent: Oct. 23, 2012

(54) EFFICIENT AMPLIFICATION STAGE

(75) Inventors: Shane Flint, Combourne (GB); Gerard Wimpenny, Cambourne (GB)

(73) Assignee: Nujira Limited (GB)

( * ) Notice: Subject to any disclaimer, the term of this patent is extended or adjusted under 35 U.S.C. 154(b) by 0 days.

(21) Appl. No.: 13/075,650

(22) Filed: Mar. 30, 2011

(65) Prior Publication Data

US 2012/0025917 A1 Feb. 2, 2012

(30) Foreign Application Priority Data

Mar. 30, 2010 (GB) .................................. 1005404.7

(51) Int. Cl.
*H03F 3/04* (2006.01)
(52) U.S. Cl. ........................ 330/297; 330/310
(58) Field of Classification Search ................. 330/297, 330/310, 150, 98
See application file for complete search history.

(56) References Cited

U.S. PATENT DOCUMENTS

| | | | |
|---|---|---|---|
| 6,256,482 B1 | 7/2001 | Raab | |
| 6,683,496 B2 * | 1/2004 | Poggi et al. | 330/132 |
| 6,734,724 B1 | 5/2004 | Schell et al. | |
| 6,753,735 B2 * | 6/2004 | Arai et al. | 330/297 |
| 7,193,471 B2 * | 3/2007 | Tsutsui et al. | 330/285 |
| 7,459,970 B2 * | 12/2008 | Yang | 330/51 |
| 7,560,984 B2 | 7/2009 | Akizuki et al. | |

FOREIGN PATENT DOCUMENTS

| | | |
|---|---|---|
| GB | 793844 A | 4/1958 |
| GB | 2465552 A | 5/2010 |

OTHER PUBLICATIONS

"British Search Report for British Application No. GB1005404.7", Jul. 9, 2010, Publisher: British Intellectual Property Office, Published in: GB.

* cited by examiner

*Primary Examiner* — Henry Choe
(74) *Attorney, Agent, or Firm* — Kaplan Breyer Schwarz & Ottesen, LLP

(57) ABSTRACT

This is disclosed an amplification stage including a first amplifier stage, a second amplifier stage, and a power supply unit, in which the output of the first stage provides the input to the second stage, and the power supply unit provides a power supply for both amplifier stages, wherein the voltage of the power supply is continuously varied in dependence of the amplitude of the signal being amplified.

20 Claims, 5 Drawing Sheets

EFFICIENT AMPLIFICATION STAGE

CROSS REFERENCE TO RELATED APPLICATIONS

British Application Number GB 1005404.7, filed Mar. 30, 2010, is incorporated herein by reference.

FIELD OF THE INVENTION

The present invention relates to amplification stages including a two-stage amplification, such as a driver stage followed by an output stage. The invention is particularly concerned with such an amplification stage in which an efficient modulated power supply is provided for both the amplification stages.

BACKGROUND OF THE INVENTION

Transistor amplifiers have a peak efficiency for a particular output power that is a function of geometry (i.e. circuit components and layout), load and supply voltage. In conventional radio frequency (RF) power amplification these characteristics are fixed based on the peak input level expected. For amplifiers presented with an input signal having a wide dynamic range, the input signal infrequently achieves peak levels and frequently operates below peak levels. Under such conditions, the amplifier may exhibit low overall efficiency.

Various techniques are known in the art for enhancing amplifier efficiency based on the supply voltage. One broad classification of solution is envelope tracking.

In a known envelope tracking technique, a switch mode pulse width variable modulator may be combined with a linear AC amplifier such that an efficient switch mode supply provides low frequency components of an output signal that contains a majority of the required power, and the linear AC amplifier provides a high bandwidth signal to provide the high frequency components of the output signal and correct errors in the switch supplied output. A power supply with high bandwidth and generally good efficiency is thereby provided. An example of an RF amplification stage incorporating a particularly advantageous technique in accordance with these principles is disclosed in British Patent No. 2398648.

The implementation of an RF amplification stage in accordance with the advantageous principles of the envelope tracking technique disclosed in the above-identified British patent results, for example, in improving an amplifier from 10% efficiency to 50% efficiency. It is desirable to look to improve the efficiency further.

A typical amplification stage includes a driver stage and an output stage. In an RF amplification stage the output stage typically comprises the RF amplifier, being the portion of the amplification stage at which high power signals are generated. The above-identified British patent teaches the introduction of an efficient envelope tracking power supply unit for providing the power supply voltage to the output stage of an amplification stage. This addresses inefficiencies in the amplification stage. However inefficiencies also exist in the driver stage, and improving the efficiency of the driver stage results in further improvement in the efficiency of the overall amplifier.

SUMMARY OF THE INVENTION

It is an aim of the present invention to provide an amplification stage having improved overall efficiency. In particular it is an aim of the present invention to provide an improved amplification stage in which the efficiency of two stages, such as a driver stage and an output stage, are improved.

There is provided an amplification stage including a first amplifier stage, a second amplifier stage, and a power supply unit, in which the output of the first stage provides the input to the second stage, and the power supply unit provides a power supply for both amplifier stages, wherein the voltage of the power supply is continuously varied in dependence of the amplitude of the signal being amplified.

The first amplifier preferably has a smaller device periphery and operates with a higher impedance load line than the second amplifier.

A delay stage, corresponding to the signal propagation delay from the output of the first amplifier stage to the output of the second amplifier stage, is preferably provided in the path from the power supply unit and the second amplifier stage.

The amplification stage may further include a first delay block connected between the power supply voltage and a voltage supply input of the first amplifier stage and a second delay block connected between the power supply voltage and a voltage supply input of the second amplifier stage, the delay of the second delay block minus the delay of the first delay block corresponding to the propagation delay from the output of the first amplifier stage to the output of the second amplifier stage.

The power supply unit may be an efficient power supply unit for generating a single power supply in dependence on the characteristics of either the first or second amplifier stage.

The first amplifier stage may not operated at the maximum power possible for the applied supply voltage.

The single power supply is generated in dependence on the characteristics of the second stage, and the silicon periphery of the transistor amplifier of the first stage is adjusted to reduce the single power supply.

There is also provided a method, in an amplification stage including a first amplifier stage, a second amplifier stage, and a power supply unit, in which the output of the first amplifier stage is connected to the input of the second amplifier stage, the method comprising providing a single power supply voltage for the first and second amplifier stages, and continuously varying the voltage of the power supply in dependence of the amplitude of the signal being amplified.

The first amplifier may have a smaller device periphery, further comprising operating the first amplifier with a higher impedance load line than the second amplifier.

The method may further comprise delaying the power supply voltage to second amplifier stages to synchronize the signals of the first and second amplifier stages by an amount corresponding to the signal propagation delay from the output of the first amplification stage to the output of the second amplification stage.

The method may further comprise delaying the power supply voltage to the first and second amplifier stages, wherein the delay to the second stage minus the delay to the first stage corresponds to the propagation delay from the output of the first stage to the output of the second stage.

The method may further comprise operating the first amplifier stage at a power which is not the maximum possible for the applied supply voltage.

The method may further comprise scaling back the amplitude of the power supply signal applied to the first amplifier stage.

The scaling back may comprise adjusting the silicon periphery of a transistor amplifier of the first amplifier stage. The method may comprise scaling back the amplitude of the power supply signal to be within the envelope of the delayed power supply signal delivered to the second amplifier stage.

BRIEF DESCRIPTION OF THE DRAWINGS

The present invention is now described by way of example with reference to the accompanying Figures, in which.

DETAILED DESCRIPTION

Figure 1:
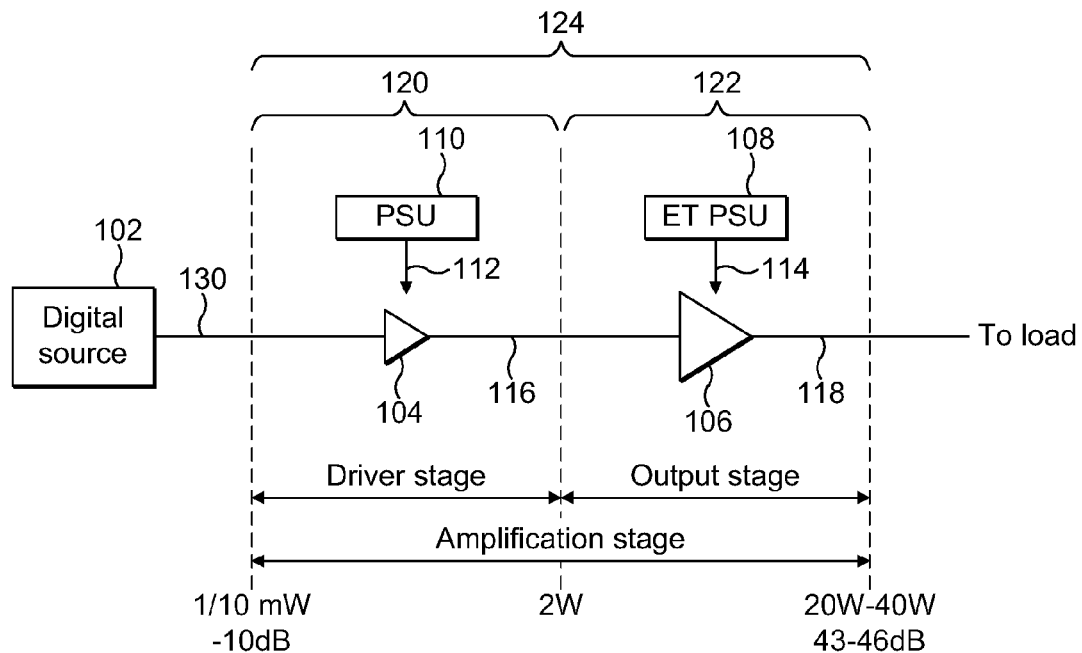
FIG. 1 illustrates the stages of a typical amplification stage, such as an RF amplification stage.

The present invention is described herein by way of particular examples and specifically with reference to preferred embodiments. It will be understood by one skilled in the art that the invention is not limited to the details of the specific embodiments given herein. In particular the invention is described herein by way of reference to the provision of a power supply voltage for an amplification stage for RF amplification applications. Whilst this represents a particularly advantageous implementation of the principles of the invention, the invention may more generally apply to any arrangement where an amplification stage is implemented in two or more stages.

In the following description with reference to the Figures, where common reference numerals appear between different Figures they refer to the same elements.

With reference to FIG. 1 there is illustrated in high-level block diagram form the main elements of an amplification stage to which embodiments of the invention may advantageously be applied. The amplification stage generally designated by reference number 124 receives on a line 130 a signal to be amplified, which signal is provided by a digital source 102. The amplification stage 124 delivers an appropriately amplified signal on line 118 to a load. A typical example implementation of an amplification stage 124 is an RF amplifier for mobile communication applications, in which the load to which the amplified signal is delivered may be an antenna.

As illustrated in FIG. 1 the amplification stage 124 includes two distinct stages: a driver stage 120 and an output stage 122. The driver stage 120 comprises a transistor amplifier denoted by reference numeral 104, which receives the signal to be amplified on line 130 and delivers an amplified version of such signal on line 116. The output stage 122 includes a transistor amplifier 106 which receives the output of the amplifier 104 on line 116, and delivers an amplified version of such signal on line 118 which forms the signal to the load. A power supply unit 110 provides a power supply signal on line 112 for the transistor amplifier stage 104. A power supply unit 108 provides a power supply signal on line 114 for the transistor amplifier 106. In order to achieve efficiencies in the amplification stage, as known in the art, the power supply unit 108 is preferably an efficient power supply unit, preferably an efficient envelope tracking power supply unit as disclosed in British Patent No. 2398648.

In a typical two-stage amplification stage, the driver 120 performs pre-amplification of a signal, prior to the signal being amplified to a required high voltage level in the output stage.

Figure 2:
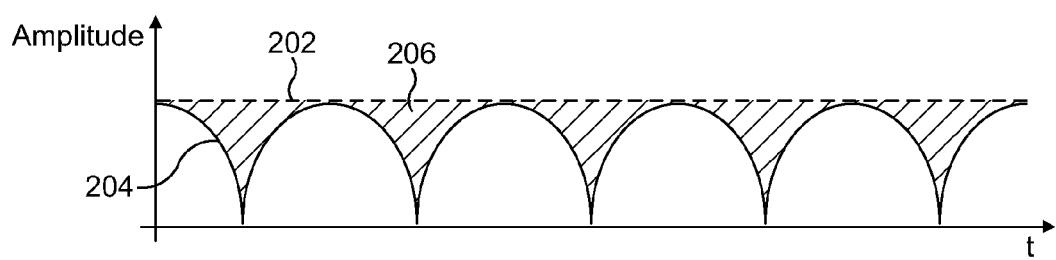
FIG. 2 is a waveform illustrating inefficiencies associated with the driver stage of the amplification stage of FIG. 1.

As set out in the background section hereinabove, the overall efficiency of the amplification stage 124 is affected by inefficiencies in the driver stage 120. With reference to FIG. 2 there is illustrated how inefficiencies in the driver stage 120 arise. FIG. 2 illustrates an amplitude versus time plot of a waveform 204 generated at the output of transistor amplifier 104. As can be seen in FIG. 2 the waveform 204, which is only exemplary, traverses between low points (which can be considered to be zero for the purposes of a simple one-sided amplifier example) and peaks (denoted by horizontal dash line 202). The area above the waveform shape 204 and below the horizontal line 202, which is denoted as a hatched area in FIG. 2, denotes wasted energy.

As an example, the input signal to the driver stage has a power level of −10 dBm, equivalent to 1/10 mW. This signal is typically amplified by the driver stage 120 to a level of around 2 W. The transistor amplifier 104 of the driver stage typically generates 30 W of power. As can be seen from FIG. 2 the output signal is generated in a very inefficient manner. An inefficient driver stage 120 contributes to an inefficient amplification stage 124.

The efficiency of the driver stage 120 could be improved by implementing the power supply unit 110 of the driver stage as an efficient power supply unit, such as an efficient envelope tracking power supply unit as used for the output stage 122. Whilst this would significantly improve the efficiency of the driver stage 120, it is an inefficient solution in other ways. Particularly it results in an increased component count and cost in the driver stage in order to provide an efficient power supply to the transistor amplifier 104.

In accordance with an embodiment of the invention, the amplification stage 124 is modified in order to provide a single power supply unit, which power supply unit is implemented in an efficient manner, and which single power supply unit provides the power supply for both the driver stage and output stage.

Before describing further embodiments of the invention in further detail, an exemplary implementation of an efficient envelope tracking power supply unit, such as may be used to implement envelope tracking power supply unit 108 of FIG. 1, is described with reference to FIG. 3. The efficient envelope tracking power supply unit 108 receives as an input the signal to be amplified on line 116. Generated as an output is a supply voltage to the transistor amplifier 106 on line 114, denoted by $V_{SUPPLY}$. The efficient envelope tracking power supply unit 108 includes an envelope detector 303, a low frequency path 330, a high frequency path 332, and a combiner 310.

In general, the low frequency path 330 acts to provide a low frequency voltage signal which is generated by a switch mode power supply in dependence upon the envelope detected by the envelope detector 303. The high frequency path 332 generates an error signal by comparing the current supply voltage generated with the envelope or reference signal. The error voltage generated by the high frequency path 332 is combined with the voltage generated by the low frequency path 330 in the combiner 310, to generate a corrected supply voltage $V_{SUPPLY}$. The low frequency path 330 may therefore be considered a "coarse" path, and the high frequency path 332 may be considered an "error" path.

The envelope detector 303 is implemented in one of various ways as known in the art to generate a signal on an output line 301 which is representative of the envelope of the waveform on line 116, which is the waveform to be amplified by the transistor amplifier 106. The output of the envelope detector 303 on line 301 forms a first input to a difference block 302 of the low frequency path 330, and a first input to a difference block 306 of the high frequency path 332.

The difference block 302 forms an output on line 314 to a low frequency amplifier 304. The output of the low frequency amplifier 304 on line 316 forms a first input to the combiner 310, and is also fed back via a line 318 to form a second input to the difference block 302.

The difference block 306 of the high frequency path forms an output on line 324 to provide an input to the high frequency amplifier 308. The high frequency amplifier 308 provides an output on line 326 which forms a second input to the combiner 310.

The combiner 310 combines the signals on lines 316 and 326 to form the output signal on line 114. The output signal on line 114 is also fed back via line 322 to form the second input to the difference block 306.

In an example application where the input signal on line 301 is an envelope derived from a video signal to be amplified, the signal has a wide frequency spectrum compared to the operating frequency bandwidth of the low frequency amplifier 304. In this system the low frequency amplifier 304 provides a large portion of the output power delivered on the output signal line 114, but is incapable of operating at the higher frequency range of the input signal. The high frequency amplifier 308 effectively operates as an error correcting or clean-up loop to provide the missing part of the output signal on line 114. The error correction or clean-up is provided by summing the signal on line 326 with the signal on line 316 to deliver a desired output signal on line 114.

The low frequency amplifier 304 is typically a switch voltage supply, in which one of a plurality of fixed voltage supplies is selected in dependence upon a current input signal. The high frequency amplifier 308 is typically an AC amplifier.

Figure 3:
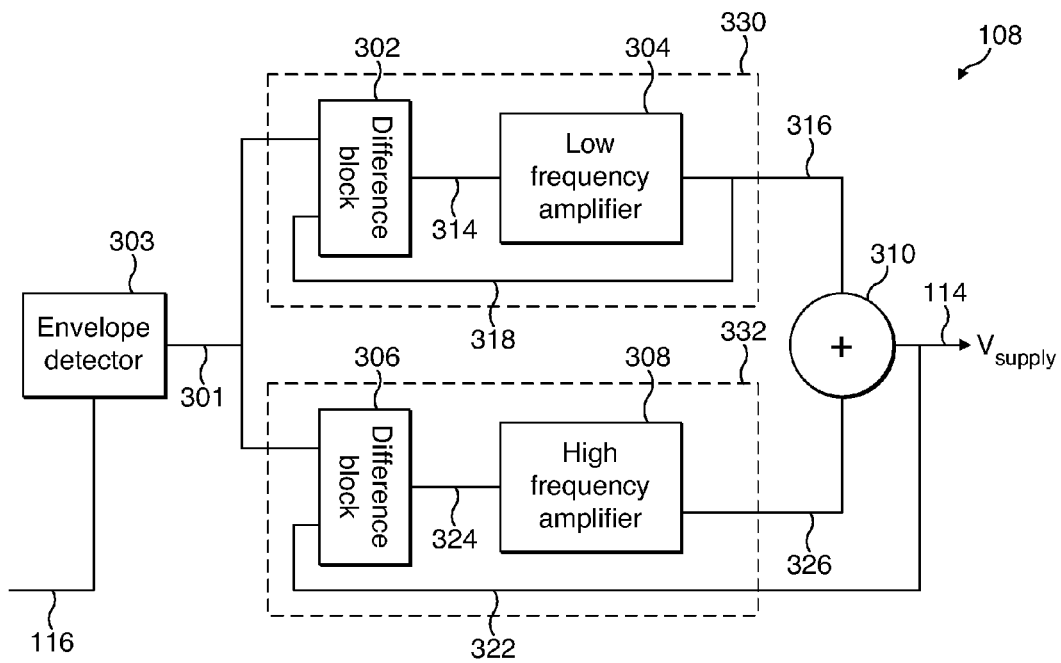
FIG. 3 illustrates schematically an efficient envelope tracking modulated power supply which may be used for generating the power supply of the output stage of the amplification stage of FIG. 1.

The schematic diagram of FIG. 3 illustrates a particularly advantageous implementation of an efficient envelope tracking power supply stage, for generating a power supply suitable for delivery to a transistor amplifier such as the amplifier 106 of the output stage of FIG. 1. The invention, and its various embodiments, is not however limited to such an implementation of an efficient power supply unit. Reference to an efficient power supply unit herein can be considered as reference to any power supply unit which offers improvements in efficiency. Such power supply unit may be any power supply unit known in the art and considered to have advantages. An embodiment of the invention is now further described with reference to FIG. 4.

Figure 4:
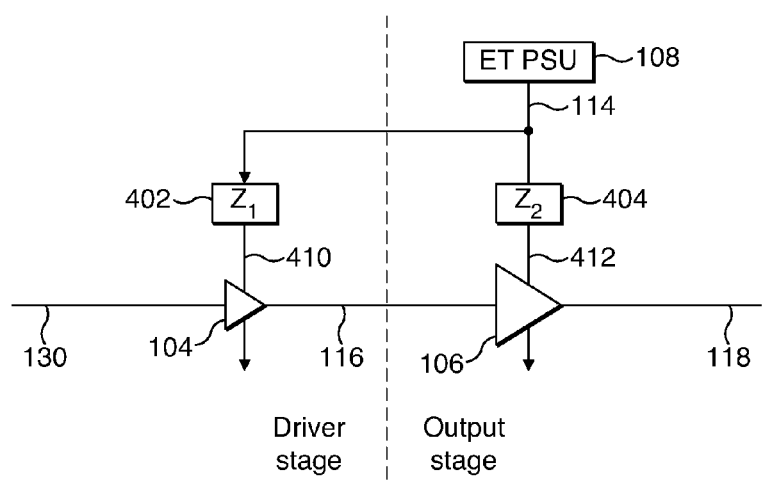
FIG. 4 illustrates a modified amplification stage in accordance with an embodiment of the invention.

In the arrangement of FIG. 4, the power supply voltage on line 114 from the envelope tracking power supply unit 108 provided as the power supply to the output stage amplifier 106 and the driver stage amplifier 104.

In this arrangement, the operating load line and periphery of the output transistors of each of the output stage amplifier 106 and the driver stage amplifier 104 are chosen to enable both amplifiers to operate efficiently using the supply voltage provided by a single modulated power supply. The load line of a transistor amplifier is the load impedance presented to the unmatched device and defines the relationship between current through the device and voltage across the device. The device periphery and load line determine the maximum linear output power capability of each of the driver stage amplifier 104 and output stage amplifier 106.

In the preferred arrangement, the impedance $Z_2$ of the supply feed to the high current output stage, as denoted by impedance 404 in FIG. 4, is designed to be lower than the impedance $Z_1$ of the supply feed to the lower current driver stage, as denoted by impedance 402 in FIG. 4. This arrangement results in minimum corruption of the power supply voltages at the connection node of supply feeds to the driver stage and output stage, on lines 410 and 412 respectively. It should be noted, however, that preferably the delay of the feed line to the output stage needs to be larger than the delay of the feed line to the driver stage, as will be explained.

Although described with reference to an arrangement in which two amplifications stages are illustrated, the arrangement in general applies to an arrangement in which a single power supply unit provide the power supply to two or more amplifier stages.

Thus the arrangements of FIG. 4 illustrates a solution to the problem of delivering a supply voltage to the driver stage and output stage of an amplification stage from a single supply voltage source generated by a single efficient power supply stage.

An additional problem arises in that the signals of the output of the driver stage and the output stage are not synchronized in time. Delays occur in each of the driver stage and output stage between the inputs and outputs of the transistor amplifiers. As such the output on line 118 from the output stage is delayed relative to the output on line 116 of the driver stage. Where the efficient power supply voltage is being generated in dependence upon signals in the output stage 122, the efficient power supply voltage is not correctly aligned for the driver stage 120.

Figure 5:
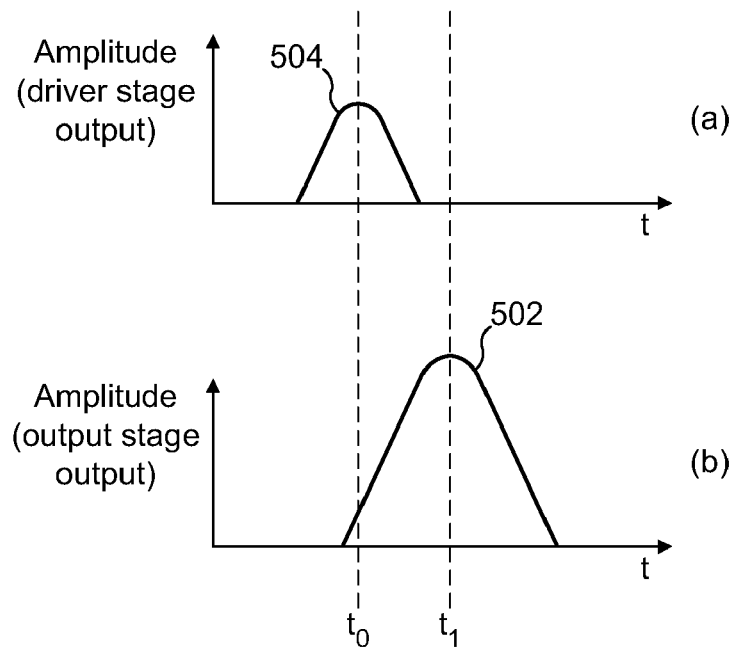
FIG. 5 illustrates a delay problem associated with a modification to the amplification stage.

With reference to FIGS. 5a and 5b, the problem resulting from the lack of synchronization in the driver stage and output stage is further illustrated. Illustrated in FIG. 5a is a sample waveform 504 at the output on line 116 of the driver stage (amplitude versus time). As can be seen, the sample waveform peaks at a time $t_0$. In FIG. 5b there is illustrated the same waveform on the output line 118 of the output stage. As can be seen the waveform 502 at the output of the output stage peaks at a time $t_1$, later than the time $t_0$.

Figure 6:
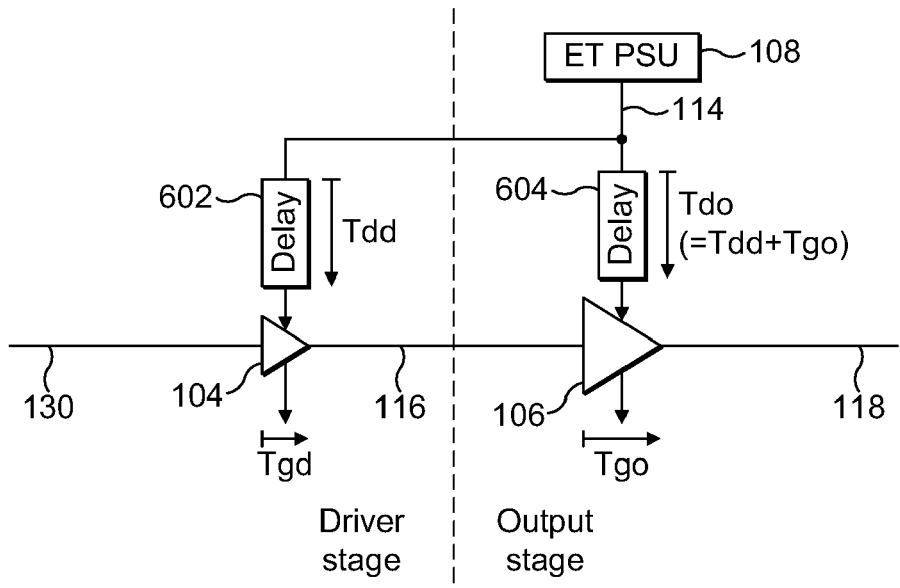
FIG. 6 illustrates a modification to the amplification stage in accordance with an embodiment of the invention.

An embodiment for addressing the synchronization problem of the signals in the driver stage of the amplification stage is illustrated with reference to FIG. 6. As can be seen in FIG. 6, a delay stage 602 is coupled between the voltage supply on line 114 and the voltage supply input to the transistor amplifier 104. A delay stage 604 is coupled between the voltage supply on line 114 and the voltage input to the transistor amplifier 106. The delay stage 602 has a delay $T_{dd}$, and the delay stage 604 has a delay $T_{do}$. In addition each of the transistor amplifiers 104 and 106 has an associated signal processing delay. The delay of the transistor amplifier 104 is denoted by $T_{gd}$, and the delay of the transistor amplifier 106 is denoted by $T_{go}$.

The values of the delay stage 602 and 604 are adjusted so as to ensure synchronization between the signals and the driver stage and the output stage. In the embodiment of FIG. 6, where the efficient power supply voltage is generated in the output stage, the delay $T_{do}$ is set to be equal to the sum of delays $T_{dd}$ and $T_{go}$. In other words the delay in delivering the power supply voltage to the transistor amplifier 106 is determined by the total of the delay in delivering the power supply voltage to the transistor amplifier 104 of the driver stage, and the delay of the transistor amplifier 106.

The embodiment of FIG. 6 describes a solution to address the problem of the alignment of signals between the driver stage and the output stage. As an alternative to the embodiment of FIG. 6 where the problem of synchronization between the driver stage and the output stage is addressed by delay stages, or as an improvement thereto, a further modification may be incorporated into the amplification stage.

Figure 7A:
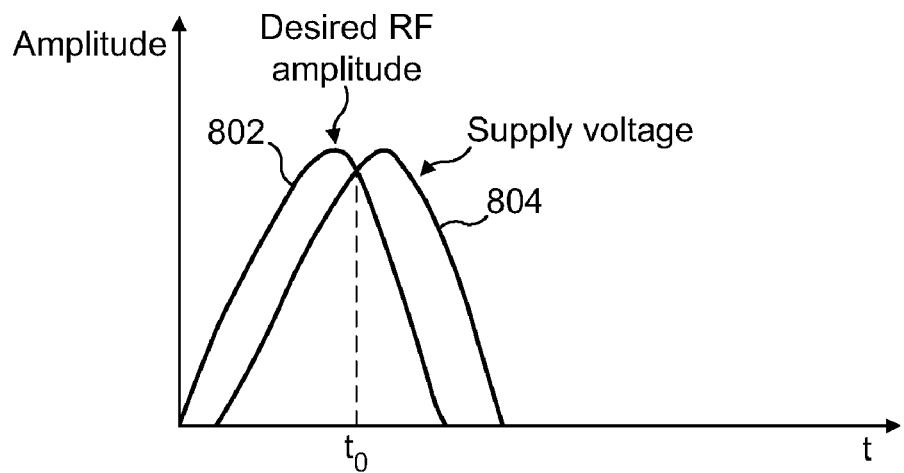
FIGS. 7a to 7d illustrate a modification to the generation of waveforms in an amplification stage in accordance with an embodiment of the invention.

With reference to FIG. 7a, there is illustrated the difficulties caused by the delay between the signals of the driver stage and the output stage. FIG. 7(a) represents a plot of supply voltage of the desired RF amplitude at the driver stage output of the amplifier 104 (waveform 802), and a plot of the supply voltage to the driver stage amplifier 104 (waveform 804), where the timing of the supply voltage has been adjusted to align with the RF signal at the output of the final stage amplifier 106 of the output stage. It can be observed in FIG. 7(a) that before time $t_0$ there is insufficient supply voltage for the driver stage amplifier 104 to generate the desired RF amplitude at the output of the amplifier 104.

Figure 7B:
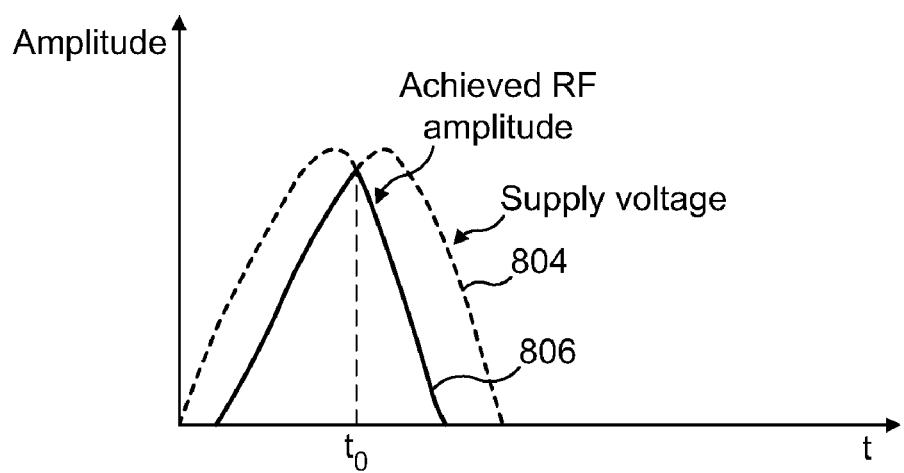

As illustrated by the solid line waveform of FIG. 7(b), comprising the rising part of the waveform 804 of FIG. 7(a), and the falling part of the waveform 802 of FIG. 7(a), the achieved RF amplitude will therefore be lower before time $t_0$. This attenuation of the output of the amplifier 104 of the driver stage introduces distortion into the RF signal, which is a consequence of timing mismatch between the RF signal and supply voltage in the driver stage. As an alternative or improvement to the delay solution of FIG. 6, the amplitude of the signal generated by the driver stage on line 116 may be scaled-back as shown by the waveform 808 of FIG. 7(c). As is demonstrated in FIG. 7(c), the amplitude of the waveform 808 of the output of the driver stage is always less than the supply voltage as denoted by waveform 804, and can therefore be amplified without distorting the RF signal amplitude, as shown in FIG. 7(d).

Figure 7C:
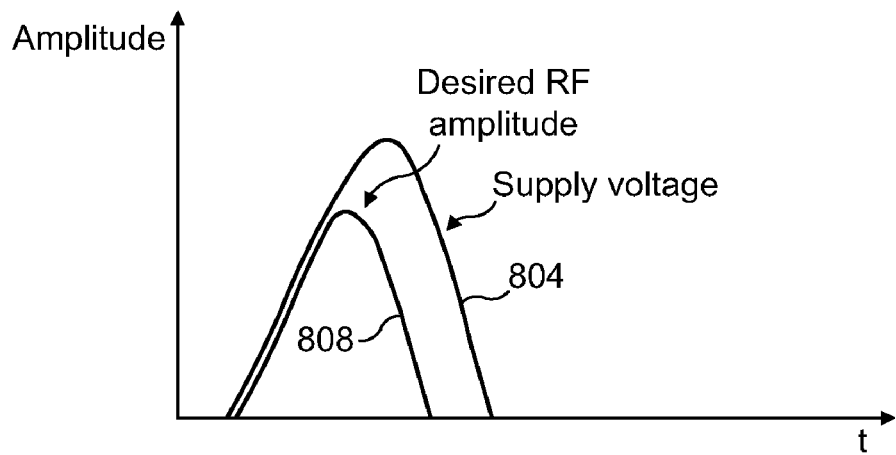
Figure 7D:
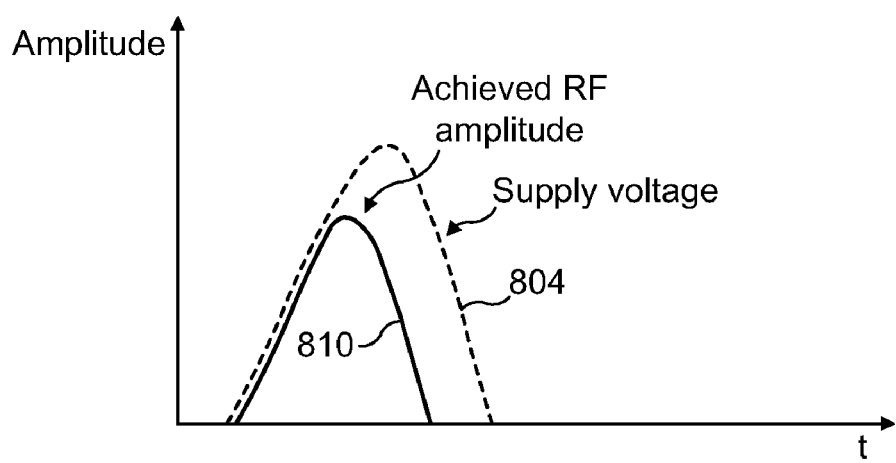

As shown in FIG. 7(d), the achieved RF amplitude as denoted by waveform 810 corresponds to the wavefrom 808 of FIG. 7(c).

The "scale-back" principle of FIG. 7(c) may be utilised in combination with the delay stages of FIG. 6. In particular this may be advantageous where the calculation of the delay does not result in accurate estimates of the delays incurred.

Thus the "delay-balancing" technique of FIG. 6 and the "back-off" or "scale-back" technique of FIG. 8c may be used in isolation or together. When used together, an optimisation may be found between determining an appropriate delay balance and an appropriate 'back-off'. This may result in neither the driver stage nor the output stage being correctly aligned but in them being aligned sufficiently that the distortion introduced by the misalignment is not excessive.

In summary, the problem of delay of signals between the driver stage and the output stage can be solved in one of three ways:

i) balancing the delay between the two stages to achieve timing alignment between supply voltage and RF envelope in both stages;

ii) backing-off the supply voltage signal in one or other of the stages; and iii) imbalancing the delay between the two stages and partially backing-off the supply voltage signal in one or other of the stages.

In an ideal implementation, the amplifiers of the driver stage 120 and 122 are linear, i.e. with a linear relationship between their respective outputs and their respective inputs. In practice, however, the amplifiers of the driver and output stages are non-linear.

In typical amplification implementations pre-distortion stages are used to create an inverse function of the amplifiers non-linear characteristic. This allows the overall characteristic of the amplification stage to be linear, despite the non-linearity of the transistor amplifiers.

The invention is described herein by way of reference to particular preferred embodiments, and particularly by way of reference to an application in a modulated voltage supply. The description is, however, only illustrative of examples. In particular the invention may be implemented more broadly than described herein.

What is claimed is:

1. An amplification stage including a first amplifier stage, a second amplifier stage, and a power supply unit, in which the output of the first stage provides the input to the second stage, and the power supply unit provides a power supply for both amplifier stages, wherein the voltage of the power supply is continuously varied in dependence of the amplitude of the signal being amplified, wherein a delay stage, corresponding to the signal propagation delay from the output of the first amplifier stage to the output of the second amplifier stage, is provided in the path from the power supply unit and the second amplifier stage.

2. The amplification stage of claim 1 wherein the first amplifier has a smaller device periphery and operates with a higher impedance load line than the second amplifier.

3. The amplification stage according to claim 1 wherein the power supply unit is an efficient power supply unit for generating a single power supply in dependence on the characteristics of either the first or second amplifier stage.

4. The amplification stage according to claim 3 wherein the first amplifier stage is not operated at the maximum power possible for the applied supply voltage.

5. The amplification stage according to claim 4 wherein the single power supply is generated in dependence on the characteristics of the second stage, and the silicon periphery of the transistor amplifier of the first stage is adjusted to reduce the single power supply.

6. An amplification stage including a first amplifier stage, a second amplifier stage, and a power supply unit, in which the output of the first stage provides the input to the second stage, and the power supply unit provides a power supply for both amplifier stages, wherein the voltage of the power supply is continuously varied in dependence of the amplitude of the signal being amplified, further including a first delay block connected between the power supply voltage and a voltage supply input of the first amplifier stage and a second delay block connected between the power supply voltage and a voltage supply input of the second amplifier stage, the delay of the second delay block minus the delay of the first delay block corresponding to the propagation delay from the output of the first amplifier stage to the output of the second amplifier stage.

7. The amplification stage of claim 6 wherein the first amplifier has a smaller device periphery and operates with a higher impedance load line than the second amplifier.

8. The amplification stage according to claim 6 wherein the power supply unit is an efficient power supply unit for generating a single power supply in dependence on the characteristics of either the first or second amplifier stage.

9. A method, in an amplification stage including a first amplifier stage, a second amplifier stage, and a power supply unit, in which the output of the first amplifier stage is connected to the input of the second amplifier stage, the method comprising providing a single power supply voltage for the first and second amplifier stages, and continuously varying the voltage of the power supply in dependence of the amplitude of the signal being amplified, further comprising delaying the power supply voltage to second amplifier stages to synchronize the signals of the first and second amplifier stages by an amount corresponding to the signal propagation delay from the output of the first amplification stage to the output of the second amplification stage.

10. The method of claim 9 wherein the first amplifier has a smaller device periphery, further comprising operating the first amplifier with a higher impedance load line than the second amplifier.

11. The method of claim 9 further comprising operating the first amplifier stage at a power which is not the maximum possible for the applied supply voltage.

12. The amplification stage of claim 9 wherein the first amplifier has a smaller device periphery and operates with a higher impedance load line than the second amplifier.

13. A method, in an amplification stage including a first amplifier stage, a second amplifier stage, and a power supply unit, in which the output of the first amplifier stage is connected to the input of the second amplifier stage, the method comprising providing a single power supply voltage for the first and second amplifier stages, and continuously varying the voltage of the power supply in dependence of the amplitude of the signal being amplified, further comprising delaying the power supply voltage to the first and second amplifier stages, wherein the delay to the second stage minus the delay to the first stage corresponds to the propagation delay from the output of the first stage to the output of the second stage.

14. The method of claim 13 wherein the first amplifier has a smaller device periphery, further comprising operating the first amplifier with a higher impedance load line than the second amplifier.

15. The method of claim 13 further comprising operating the first amplifier stage at a power which is not the maximum possible for the applied supply voltage.

16. The amplification stage of claim 13 wherein the first amplifier has a smaller device periphery and operates with a higher impedance load line than the second amplifier.

17. A method, in an amplification stage including a first amplifier stage, a second amplifier stage, and a power supply unit, in which the output of the first amplifier stage is connected to the input of the second amplifier stage, the method comprising providing a single power supply voltage for the first and second amplifier stages, and continuously varying the voltage of the power supply in dependence of the amplitude of the signal being amplified, further comprising scaling back the amplitude of the power supply signal applied to the first amplifier stage, and to be within the envelope of the delayed power supply signal delivered to the second amplifier stage.

18. The method of claim 17 wherein the scaling back comprises adjusting the silicon periphery of a transistor amplifier of the first amplifier stage.

19. The amplification stage according to claim 18 wherein the first amplifier stage is not operated at the maximum power possible for the applied supply voltage.

20. The amplification stage according to claim 17 wherein the single power supply is generated in dependence on the characteristics of the second stage, and the silicon periphery of the transistor amplifier of the first stage is adjusted to reduce the single power supply.

* * * * *